(12) United States Patent
Huang et al.

(10) Patent No.: US 10,700,096 B2
(45) Date of Patent: Jun. 30, 2020

(54) ARRAY SUBSTRATE, MANUFACTURING METHOD THEREOF AND DISPLAY PANEL

(71) Applicants: BOE TECHNOLOGY GROUP CO., LTD., Beijing (CN); CHENGDU BOE OPTOELECTRONICS TECHNOLOGY CO., LTD., Sichuan (CN)

(72) Inventors: Peng Huang, Beijing (CN); Shuquan Yang, Beijing (CN); Wei Wang, Beijing (CN); Yanxin Wang, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu, Sichuan (CN)

(*) Notice: Subject to any disclaimer, the term of this patent is extended or adjusted under 35 U.S.C. 154(b) by 0 days.

(21) Appl. No.: 16/184,426

(22) Filed: Nov. 8, 2018

(65) Prior Publication Data
US 2019/0189640 A1   Jun. 20, 2019

(30) Foreign Application Priority Data
Dec. 15, 2017   (CN) .......................... 2017 1 1346233

(51) Int. Cl.
| | |
|---|---|
| *H01L 51/00* | (2006.01) |
| *H01L 27/12* | (2006.01) |
| *H05K 1/02* | (2006.01) |
| *G02F 1/1345* | (2006.01) |
| *H01L 27/32* | (2006.01) |

(52) U.S. Cl.
CPC ...... *H01L 27/1218* (2013.01); *G02F 1/13452* (2013.01); *H01L 27/3276* (2013.01); *H01L 51/0097* (2013.01); *H05K 1/028* (2013.01); *H05K 2201/056* (2013.01); *H05K 2201/10136* (2013.01)

(58) Field of Classification Search
CPC .............. G02F 1/1333; G02F 1/13452; H01L 27/1218; H01L 51/0097; H05K 1/028
See application file for complete search history.

(56) References Cited

U.S. PATENT DOCUMENTS

| | | | | |
|---|---|---|---|---|
| 2014/0254111 A1* | 9/2014 | Yamazaki | ........... | H01L 27/3276 361/749 |
| 2014/0346474 A1* | 11/2014 | Jeong | ...................... | H01L 27/32 257/40 |

* cited by examiner

*Primary Examiner* — William F Kraig
*Assistant Examiner* — Khatib A Rahman
(74) *Attorney, Agent, or Firm* — Brooks Kushman P.C.

(57) ABSTRACT

An array substrate, a manufacturing method thereof and a display panel are provided. The array substrate includes a base substrate and a wiring layer. The base substrate includes a peripheral region, a bending region and a driving circuit region. The bending region is arranged between the driving circuit region and the peripheral region. A portion of the base substrate at the bending region is a stress buffer member arranged at an end of the bending region adjacent to the peripheral region, connected to a portion of the base substrate at the peripheral region, and spaced apart from a portion of the base substrate at the driving circuit region.

13 Claims, 13 Drawing Sheets

ARRAY SUBSTRATE, MANUFACTURING METHOD THEREOF AND DISPLAY PANEL

CROSS-REFERENCE TO RELATED APPLICATION

This application claims priority to Chinese Patent Application No. 201711346233.7 filed on Dec. 15, 2017, which is incorporated herein by reference in its entirety.

TECHNICAL FIELD

The present disclosure relates to the field of display technology, in particular to an array substrate, a manufacturing method thereof and a display panel.

BACKGROUND

Along with the rise of the global information society, the demand for various display devices has increased, and a lot of effort has been put in research and development of various flat-panel display devices, e.g., liquid crystal displays (LCDs), plasma display panels (PDPs), electroluminescent displays (ELDs), organic light-emitting diode (OLED) display devices, and vacuum fluorescent displays (VFDs).

With the popularization of the display devices, not only the functions and performance but also the appearance of the display devices is highly demanded. Such factors as being light and thin and a narrow bezel have been taken into consideration during the selection of the display devices.

In order to provide the display device with a narrow bezel, usually a binding region of a panel is directly bent. However, when bending the binding region, it is necessary to remove a base material from a back film structure at the binding region. At this time, stress concentration may occur for a metal line at a peripheral position of the back film structure, so the metal line may easily be broken, and thereby the flexibility and reliability of the resultant product may be adversely affected.

SUMMARY

In one aspect, the present disclosure provides in some embodiments an array substrate, including a base substrate and a wiring layer. The base substrate includes a peripheral region, a bending region and a driving circuit region. The bending region is arranged between the driving circuit region and the peripheral region. A portion of the base substrate at the bending region is a stress buffer member arranged at an end of the bending region adjacent to the peripheral region, connected to a portion of the base substrate at the peripheral region, and spaced apart from a portion of the base substrate at the driving circuit region.

Optionally, the portion of the base substrate at the driving circuit region is arranged parallel to, and opposite to, the portion of the base substrate at the peripheral region, and the stress buffer member abuts against the wiring layer.

Optionally, an end of the stress buffer member connected to the portion of the base substrate at the peripheral region has a thickness greater than an end of the stress buffer member away from the portion of the base substrate at the peripheral region.

Optionally, the stress buffer member is provided with an oblique surface adjacent to the wiring layer and angled relative to the portion of the base substrate at the peripheral region at an angle of 40° to 70°.

Optionally, the stress buffer member has a thickness smaller than the portions of the base substrate at the peripheral region and the driving circuit region, and the stress buffer member and the portion of the base substrate at the peripheral region together form a step-like structure.

Optionally, the stress buffer member is provided with a first surface, a second surface and an arc surface away from a portion of the wiring layer corresponding to the bending region, the first surface and the second surface are arranged parallel to the portions of the base substrate at the peripheral region and the driving circuit region and connected to each other through the arc surface, and the first surface is arranged adjacent to the peripheral region.

Optionally, a first side surface of the portion of the base substrate at the peripheral region adjacent to the stress buffer member is an oblique surface inclined relative to the first surface of the stress buffer member, and the first side surface and the first surface of the stress buffer member together form the step-like structure.

Optionally, the thickness of the stress buffer member is 5 μm to 10 μm.

Optionally, a surface of the stress buffer member away from the portion of the wiring layer corresponding to the bending region is serrated.

Optionally, a side surface of the stress buffer member away from the wiring layer is a curved surface protruded in a direction away from the wiring layer, and the thickness of the end of the stress buffer member connected to the portion of the base substrate at the peripheral region and the thickness of the end of the stress buffer member away from the portion of the base substrate at the peripheral region are each smaller than a thickness of the other portion of the stress buffer member.

Optionally, a protection layer is arranged at a side surface of the wiring layer away from the base substrate, and a thickness of a portion of the protection layer covering the stress buffer layer is greater than a thickness of the other portion of the protection layer.

Optionally, the protection layer is arranged at a side of the wiring layer away from the portion of the base substrate at the peripheral region, a side of the wiring layer away from the portion of the base substrate at the bending region and a side of the wiring layer away from the portion of the base substrate at the driving circuit region.

Optionally, a thickness of a portion of the protection layer at a side of the wiring layer away from the stress buffer member is greater than a thickness of a portion of the protection layer at the side of the wiring layer away from the portion of the base substrate at the peripheral region and a thickness of a portion of the protection layer at the side of the wiring layer away from the portion of the base substrate at the driving circuit region.

Optionally, a buffer member is arranged between the portion of the base substrate at the driving circuit region and the portion of the base substrate at the peripheral region.

In another aspect, a display panel including the above-mentioned array substrate is further provided in the present disclosure.

In yet another aspect, a method for manufacturing an array substrate is further provided in the present disclosure, including: dividing a base substrate into a peripheral region, a bending region and a driving circuit region, the bending region being arranged between the driving circuit region and the peripheral region; removing a part of the base substrate at the bending region, to enable the remaining base substrate at the bending region to form a stress buffer member connected to a portion of the base substrate at the peripheral region; and bending a portion of a wiring layer corresponding to the bending region, to enable a portion of the base substrate at the driving circuit region to be parallel to, and opposite to, the portion of the base substrate at the peripheral region.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Figure 1:
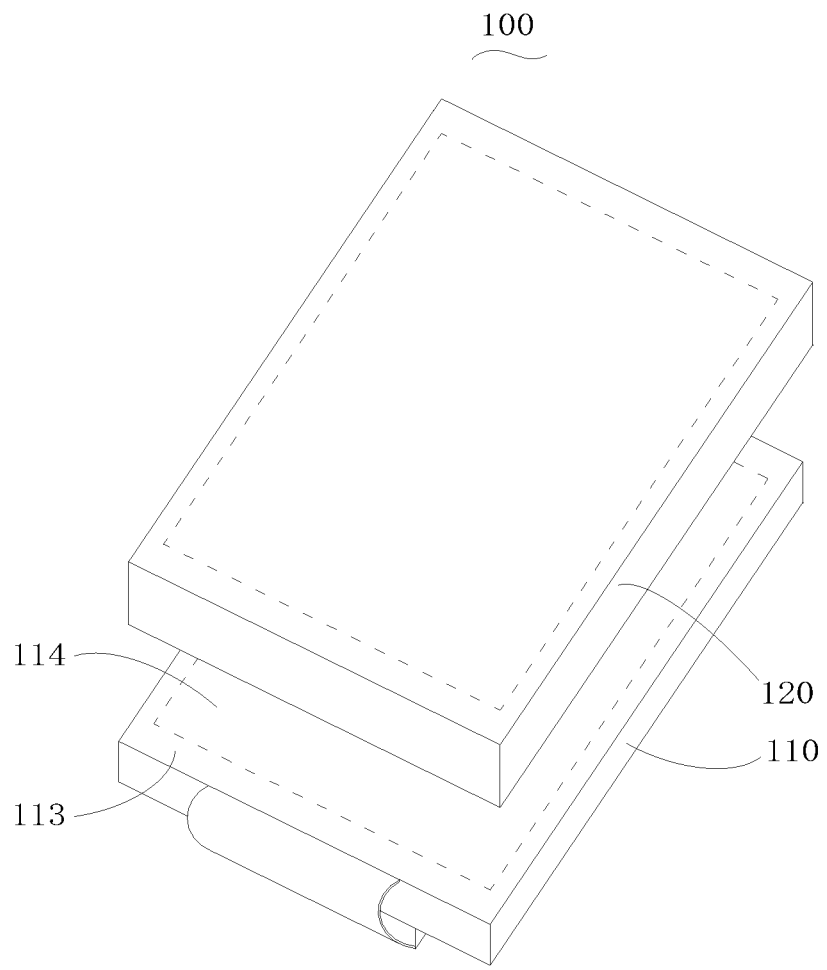
FIG. 1 is a solid view of a display panel in some embodiments of the present disclosure.

As shown in FIG. 1 which is a solid view of a display panel in some embodiments of the present disclosure, the display panel 100 includes an array substrate 110, an opposite substrate 120 arranged opposite to the array substrate 110, and a liquid crystal layer arranged between the array substrate 110 and the opposite substrate 120.

Figure 2:
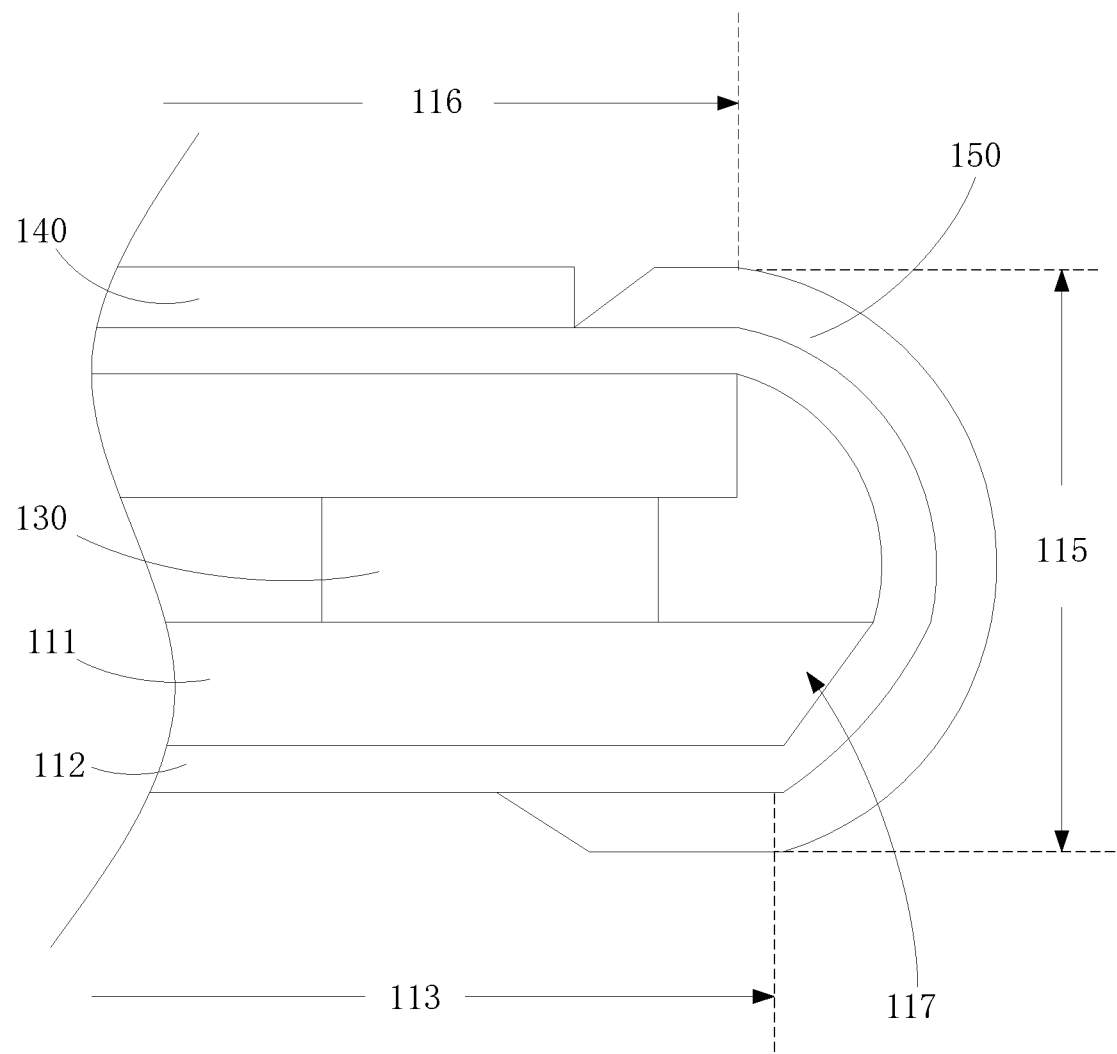
FIG. 2 is a partially sectional view of an array substrate in FIG. 1.

As shown in FIG. 2 which is a partially sectional view of the array substrate in FIG. 1, the array substrate 110 includes a base substrate 111 and a wiring layer 112. The base substrate 111 includes a peripheral region 113, a functional region 114, a bending region 115 and a driving circuit region 116. The peripheral region 113 surrounds the functional region 114 and corresponds to a non-display region of the display panel 100. The functional region 114 corresponds to a display region of the display panel 100.

The bending region 115 and the driving circuit region 116 are arranged at one end of the base substrate 111, and the bending region is arranged between the peripheral region 113 and the driving circuit region 116. A width of each of the bending region 115 and the driving circuit region 116 is smaller than a width of the peripheral region 113. The wiring layer 112 is arranged at the bending region 115, the driving circuit region 116 and the peripheral region 113. To be specific, the wiring layer 112 may be merely arranged at the peripheral region 113 between the functional region 114 and the bending region 115, the bending region 115 and the driving circuit region 116. The wiring layer 112 includes a flexible membrane and wires arranged on the flexible membrane.

A thickness of the base substrate 111 is 0 µm to 30 µm, and in a possible embodiment of the present disclosure, the thickness of the base substrate 111 is 30 µm.

A part of the base substrate 111 at the bending region 115 is removed, and the remaining base substrate 111 at the bending region 115 forms a stress buffer member 117. The stress buffer member 117 is arranged at an end of the bending region 115 adjacent to the peripheral region 113, connected to a portion of the base substrate 111 at the peripheral region 113, and abuts against the wiring layer 112.

A portion of the wiring layer 112 at the bending region 115 is bent, so that a portion of the base substrate 111 at the driving circuit region 116 is arranged parallel to, and opposite to, the portion of the base substrate 111 at the peripheral region 113.

In order to facilitate the bending of the portion of the wiring layer 112 at the bending region 115 and protect the wiring layer 112, the stress buffer member 117 may be of an uneven thickness. To be specific, an end of the stress buffer member 117 connected to the portion of the base substrate 111 at the peripheral region 113 may have a thickness greater than an end of the stress buffer member 117 away from the portion of the base substrate 111 at the peripheral region 113. In other words, in a possible embodiment of the present disclosure, the stress buffer member 117 is provided with an oblique surface adjacent to the wiring layer 112, and an inclination direction of the oblique surface corresponds to a bending direction of the wiring layer 112.

Optionally, an angle between the oblique surface and the portion of the base substrate 111 at the peripheral region 113 is 40° to 70°.

The display panel 100 further includes a buffer layer 130, a circuit board 140 and a protection layer 150. The buffer layer 130 is arranged between the portion of the base substrate 111 at the driving circuit region and the portion of the base substrate at the peripheral region 113. The circuit board 140 is bound to the array substrate 110, arranged at a side of the wiring layer 112 at the driving circuit region 116 away from the base substrate 111, and electrically connected to the wires at the wiring layer 112. The protection layer 150 is arranged at a side of the wiring layer 112 away from the base substrate 111, and covers the wiring layer 112 at the bending region 115, a part of the wiring layer 112 at the driving circuit region 116 and a part of the wiring layer 112 at the peripheral region 113.

Figure 3:
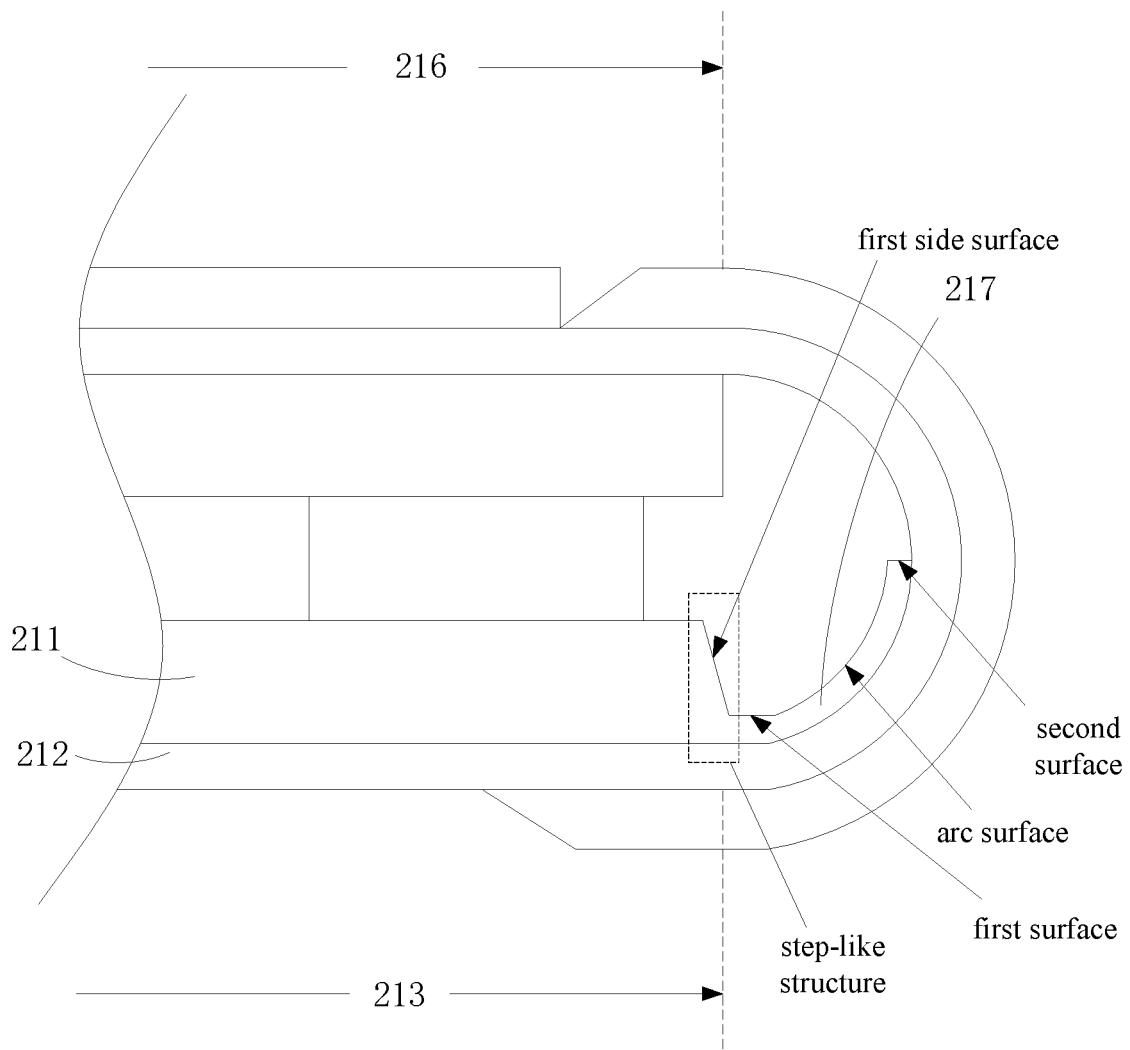
FIG. 3 is another partially sectional view of the array substrate in some embodiments of the present disclosure.

FIG. 3 is another partially sectional view of the array substrate, and it differs from FIG. 2 in that a stress buffer member 217 is provided with a flat surface adjacent to a wiring layer 212, and the flat surface is curved along with the wiring layer 212 so as to form an arc surface.

The stress buffer member 217 is further provided with a flat surface away from the wiring layer 212 and parallel to the flat surface adjacent to the wiring layer 212. A thickness of the stress buffer member 217 is smaller than a thickness of a portion of a base substrate 211 at a peripheral region 213 or a driving circuit region 216, i.e., the stress buffer member 217 and the portion of the base substrate 211 at the peripheral region 213 together form a step-like structure.

As shown in FIG. 3, the stress buffer member 217 is provided with a first surface, a second surface and an arc surface away from the wiring layer 212 corresponding to the bending region 115. The first surface and the second surface are each arranged parallel to the portions of the base substrate at the peripheral region 213 and the driving circuit region 216, and connected to each other through the arc surface. The first surface is arranged adjacent to the peripheral region.

As shown in FIG. 3, a first side surface of the portion of the base substrate at the peripheral region 213 adjacent to the stress buffer member 217 is an oblique surface inclined relative to the first surface of the stress buffer member 217, and the first side surface and the first surface of the stress buffer member 217 together form the step-like structure.

The stress buffer member 217 has a length of 10 µm to 50 µm, and a thickness of 5 µm to 10 µm.

In some embodiments of the present disclosure, the stress buffer member 217 has a thickness of 5 µm to 10 µm.

Figure 4:
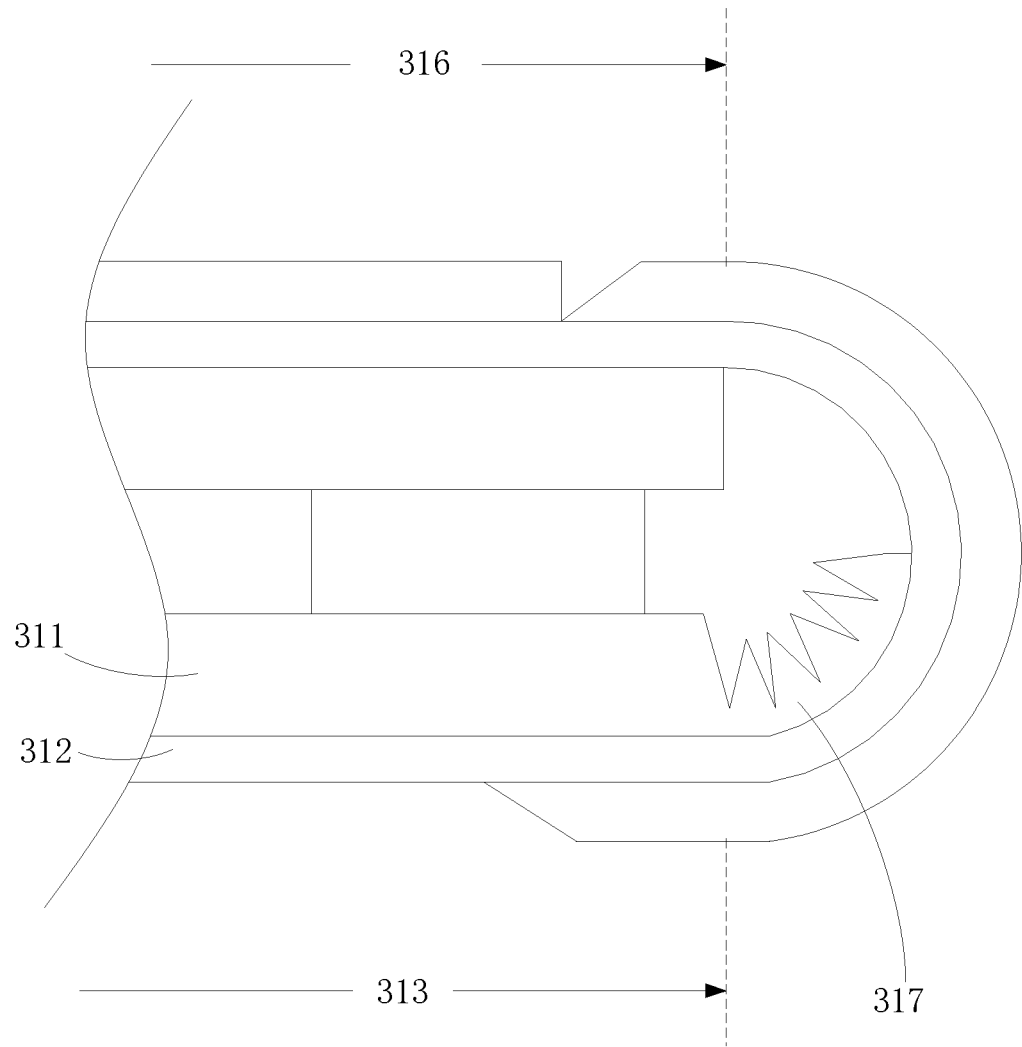
FIG. 4 is yet another partially sectional view of the array substrate in some embodiments of the present disclosure.

FIG. 4 is yet another partially sectional view of the array substrate, and it differs from FIG. 2 in that a stress buffer member 317 is provided with a flat surface adjacent to a wiring layer 312, and the flat surface is curved along with the wiring layer 312 so as to form an arc surface.

A side surface of the stress buffer member 317 away from the wiring layer 312 is serrated. A distance between each protrusion of a serrated structure, i.e., a ridge of the serrated structure, and the side surface of the stress buffer member 317 away from the wiring layer 312, i.e., a thickness of the stress buffer member 317, is smaller than a thickness of a portion of a base substrate 311 at each of a peripheral region 313 and a driving circuit region 316.

Figure 5:
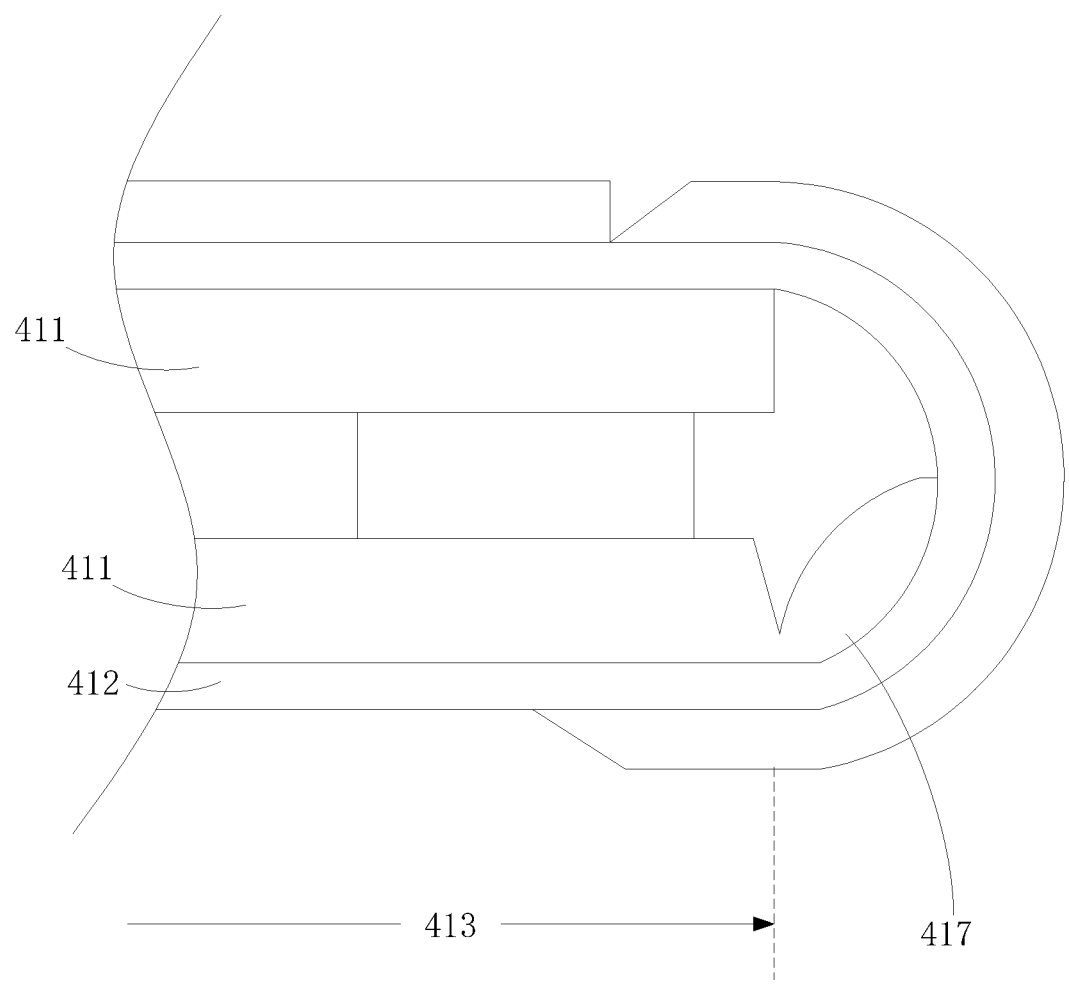
FIG. 5 is still yet another partially sectional view of the array substrate in some embodiments of the present disclosure.

FIG. 5 is still yet another partially sectional view of the array substrate, and it differs from FIG. 4 in that a stress buffer member 417 is provided with a curved surface away from a wiring layer 412 and protruding in a direction away from the wiring layer 412. A thickness of an end of the stress buffer member 417 connected to a portion of a base substrate 411 at a peripheral region 413 and a thickness of an end of the stress buffer member 417 away from the portion of the base substrate 411 at the peripheral region 413 are each smaller than a thickness of the other portion of the stress buffer member 417.

Figure 6:
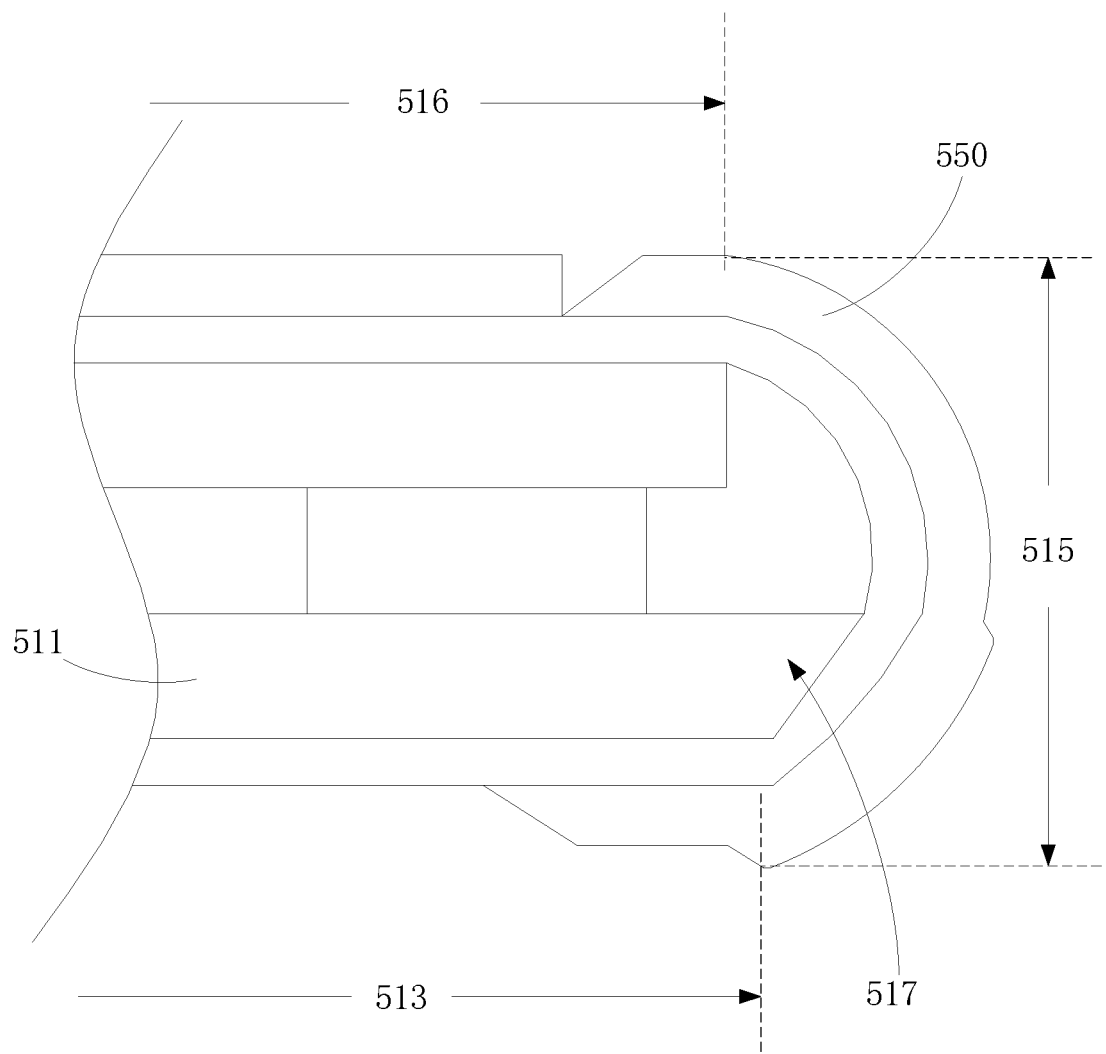
FIG. 6 is still yet another partially sectional view of the array substrate in some embodiments of the present disclosure.

FIG. 6 is still yet another partially sectional view of the array substrate, and it differs from FIG. 2 in that a thickness of a portion of a protection layer 550 covering a stress buffer layer 517 is greater than a thickness of the other portion of the protection layer 550. In other words, the thickness of the portion of the protection layer 550 at a bending region 515 and above the stress buffer member 517 is greater than a thickness of a portion of the protection layer 550 above a remaining part of a base substrate 511 at the bending region 515, a thickness of a portion of the protection layer 550 at a driving circuit region 516, and a thickness of a portion of the protection layer 550 at a peripheral region 513.

As shown in FIG. 6, the protection layer 550 is arranged at a side of the wiring layer away from the portion of the base substrate the peripheral region 513, a side of the wiring layer away from the portion of the base substrate at the bending region 515, and a side of the wiring layer away from the portion of the base substrate at the driving circuit region 516.

As shown in FIG. 6, the thickness of the portion of the protection layer 550 at a side of the wiring layer away from the stress buffer member 517 is greater than a thickness of the portion of the protection layer 550 at a side of the wiring layer away from the portion of the base substrate at the peripheral region 513 and a thickness of the portion of the protection layer 550 at a side of the wiring layer away from the portion of the base substrate at the driving circuit region 516.

Figure 7:
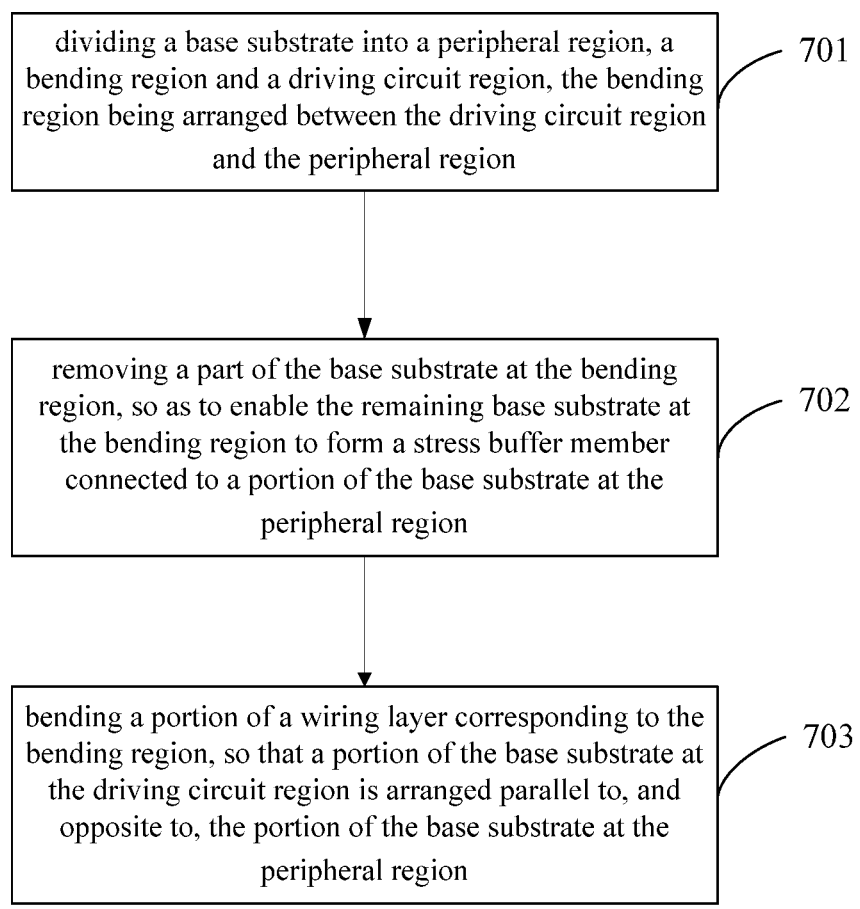
FIG. 7 is a flow chart of a method for manufacturing the array substrate in some embodiments of the present disclosure.

FIG. 7 is a flow chart of a method for manufacturing an array substrate, and FIGS. 8 to 13 are partially sectional views of the array substrate manufactured using the method in FIG. 7. As shown in FIG. 7, the method includes the following steps.

Step 701: dividing a base substrate into a peripheral region, a bending region and a driving circuit region, the bending region being arranged between the driving circuit region and the peripheral region.

Figure 8:
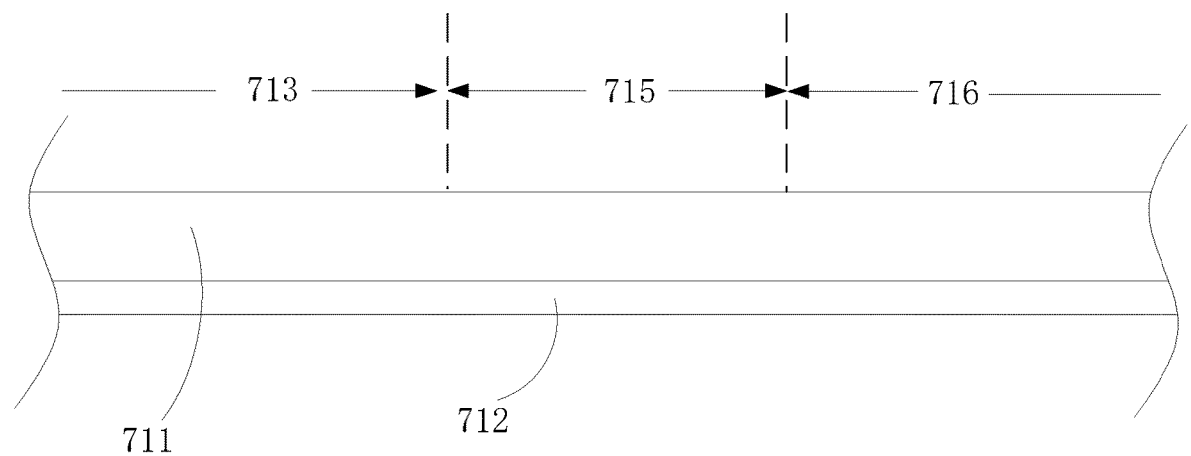
FIGS. 8 to 13 are partially sectional views of the array substrate manufactured using the method in FIG. 7.

In this step, the base substrate 711 may be provided and then the peripheral region 713 may be determined. Next, at one end of the base substrate 711, a part of the base substrate at the peripheral region 713 may be cut, so as to acquire a binding region for binding connection and having a width smaller than the peripheral region 713. Next, the binding region may be divided into the bending region 715 and the driving circuit region 716. The bending region 715 is arranged between the driving circuit region 716 and the peripheral region 713, as shown in FIG. 8.

After the formation of the bending region, a wiring layer 712 may be formed at the bending region 715, the driving circuit region 716 and the peripheral region 713.

Step 702: removing a part of the base substrate at the bending region, so as to enable the remaining base substrate at the bending region to form a stress buffer member connected to a portion of the base substrate at the peripheral region.

In this step, after the formation of the bending region 715 and the driving circuit region 716, the base substrate 711 at the bending region 715 may be treated, so as to remove a part of the base substrate 711 at the bending region 715, and enable the remaining base substrate 711 at the bending region 715 to form the stress buffer member 717.

The stress buffer member 717 is arranged at an end of the bending region 715 adjacent to the peripheral region 713, connected to the portion of the base substrate 711 at the peripheral region 713, and abuts against the wiring layer 712.

Figure 9:
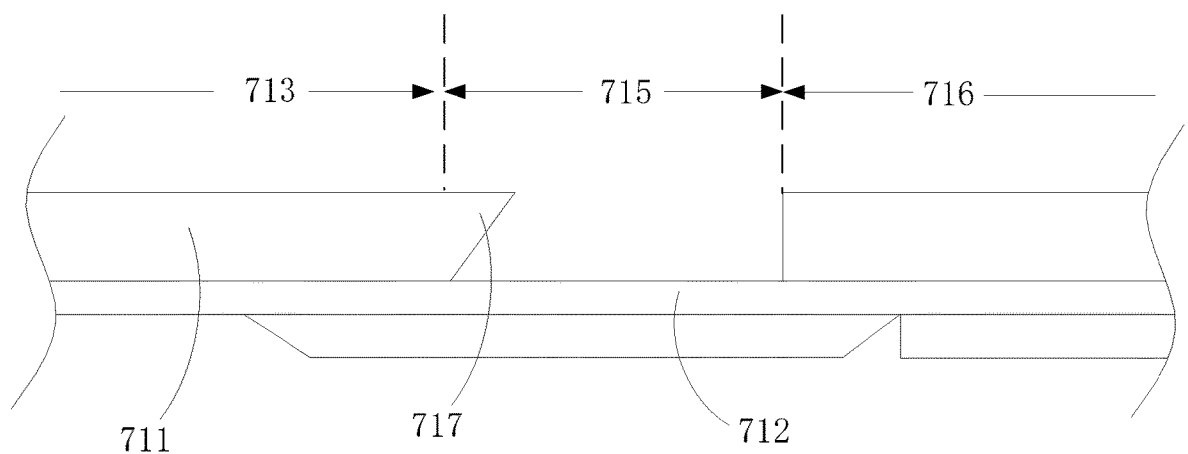

To be specific, the wiring layer 712 may be formed at the bending region 715 and the driving circuit region 716, and an incident angle of a laser beam from a laser source may be adjusted, so as to cut off a part of the base substrate 711 at the bending region 715, thereby to acquire the stress buffer member 717 with an oblique surface. An angle between the oblique surface of the stress buffer member 717 and the portion of the base substrate 711 at the peripheral region 713 is 40° to 70°, as shown in FIG. 9.

Figure 10:
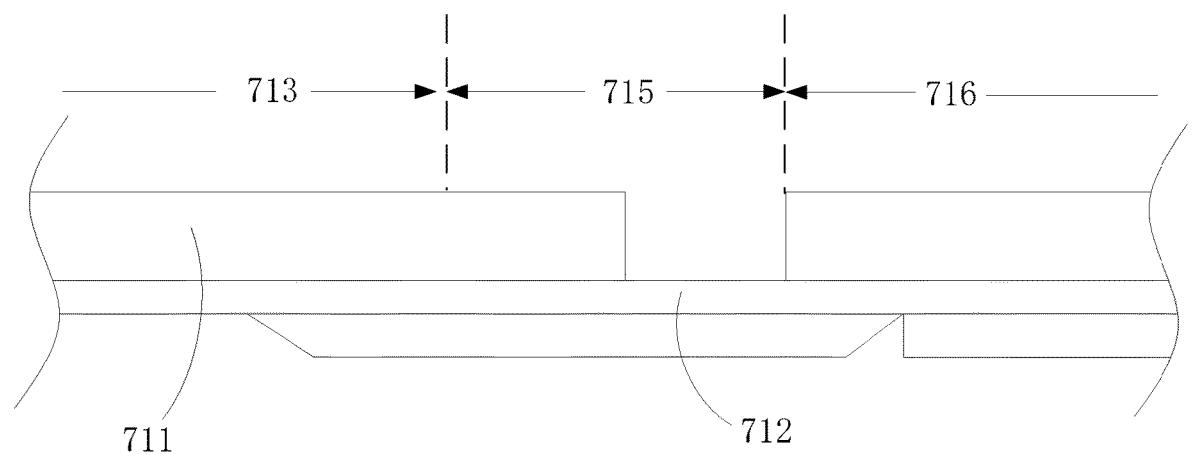
Figure 11:
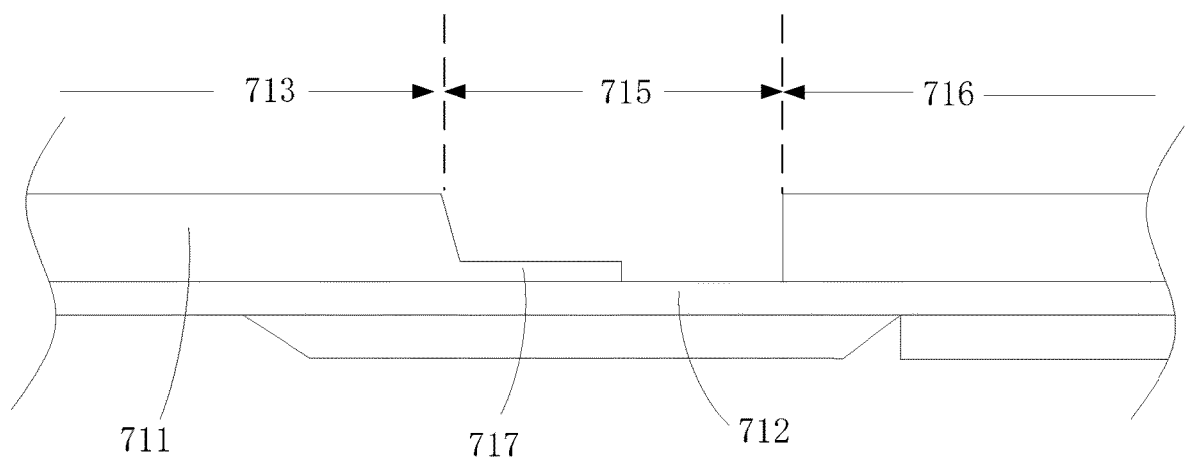

Optionally, the wiring layer 712 may be formed at the bending region 715 and the driving circuit region 716, and the incident angle of the laser beam from the laser source may be adjusted so as to cut off a part of the base substrate 711 at the bending region 715, so that an end of the remaining base substrate 711 away from the peripheral region is spaced apart from the peripheral region 713 by a distance of 10 µm to 50 µm and connected to the portion of the base substrate at the peripheral region 713, as shown in FIG. 10. Next, a part of the remaining base substrate 711 having a thickness of about 20 µm to 25 µm may be removed continuously, so as to acquire the stress buffer member 717 having a thickness of 5 µm to 10 µm and having a flat surface, as shown in FIG. 11.

Figure 12:
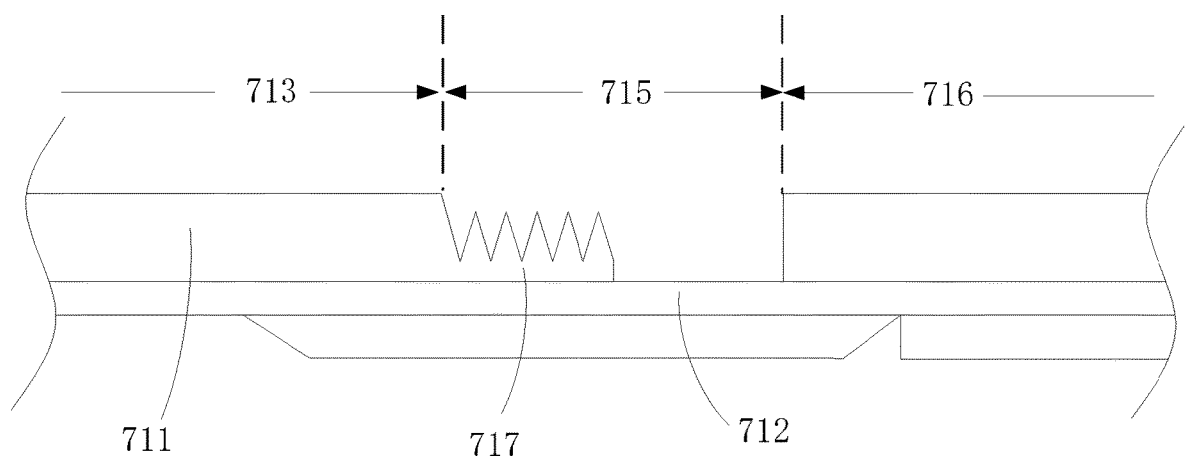

Optionally, the wiring layer 712 may be formed at the bending region 715 and the driving circuit region 716, and the incident angle of the laser beam from the laser source may be adjusted so as to cut off a part of the base substrate 711 at the bending region 715, so that an end of the remaining base substrate 711 away from the peripheral region is spaced apart from the peripheral region 713 by a distance of 10 μm to 50 μm and connected to the portion of the base substrate at the peripheral region 713, as shown in FIG. 10. Next, the energy of the laser source may be reduced to one fifth to one tenth of the energy for removing the part of the base substrate 711 at the bending region 715, so as to removing a part of the remaining base substrate 711 at the bending region 715 continuously, thereby to acquire the stress buffer member 717 having a serrated surface, as shown in FIG. 12.

Figure 13:
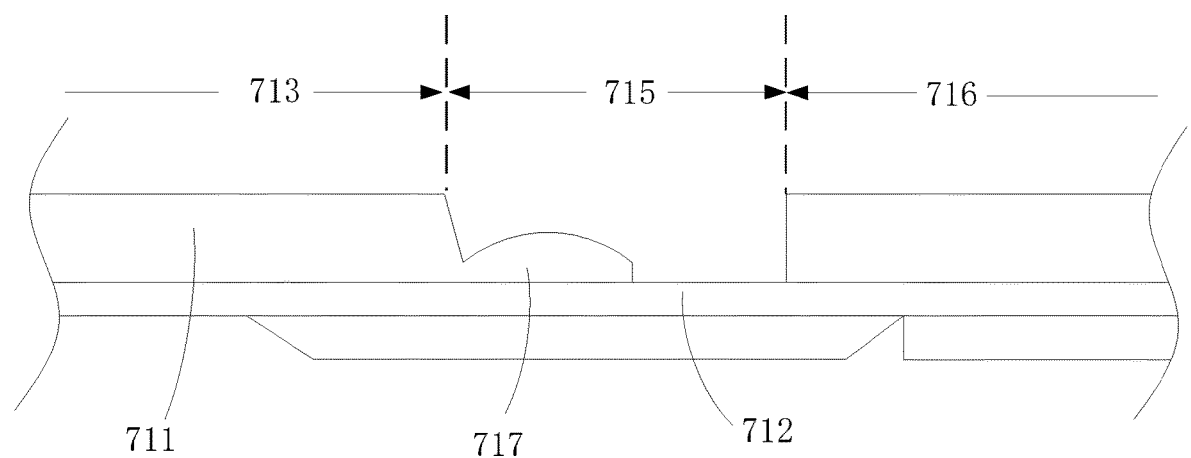

Optionally, the wiring layer 712 may be formed at the bending region 715 and the driving circuit region 716, and the incident angle of the laser beam from the laser source may be adjusted so as to cut off a part of the base substrate 711 at the bending region 715, so that an end of the remaining base substrate 711 away from the peripheral region is spaced apart from the peripheral region 713 by a distance of 10 μm to 50 μm and connected to the portion of the base substrate at the peripheral region 713, as shown in FIG. 10. Next, a part of the remaining base substrate 711 having a thickness of 5 μm to 10 μm may be removed continuously, so as to acquire the stress buffer member 717 having a curved surface protruding in a direction away from the wiring layer 712, as shown in FIG. 13.

Step 703: bending a portion of the wiring layer corresponding to the bending region, so that a portion of the base substrate at the driving circuit region is arranged parallel to, and opposite to, the portion of the base substrate at the peripheral region.

In this step, after the formation of the stress buffer member 717 at the bending region 715, the wiring layer 712 at the bending region 715 may be bent, so as to move the portion of the base substrate 711 and the wiring layer 712 at the driving circuit region 716 to be located at the back of the base substrate 711 at the peripheral region 713, and enable the portion of the base substrate 711 at the driving circuit region 716 to be parallel to, and opposite to, the portion of the base substrate 711 at the peripheral region 713, thereby to acquire the array substrate as shown in FIG. 2, 3, 4 or 5.

To be specific, prior to or subsequent to bending the wiring layer at the bending region 715, a buffer layer may be arranged at a side of the portion of the base substrate 711 at the driving circuit region 716 (i.e., between the portion of the base substrate 711 at the driving circuit region 716 and the portion of the base substrate 711 at the peripheral region 713), so as to support and protect the wiring layer.

Optionally, prior to Step 703, the method further includes binding a circuit board to the driving circuit region, and forming a protection layer at least covering the wiring layer at the bending region at a side of the wiring layer away from the base substrate.

In this step, prior to bending the wiring layer at the bending region 715 so as to enable the portion of the base substrate 711 at the driving circuit region 716 to be parallel to and opposite to the portion of the base substrate 711 at the peripheral region 713, the circuit board 740 may be bound and the protection layer 750 may be formed. To be specific, the circuit board 740 may be bound to the driving circuit region 716, arranged at a side of the wiring layer 712 at the driving circuit region 716 away from the base substrate 711, and electrically connected to wires at the wiring layer 712.

The protection layer 750 may be formed at a side of the wiring layer 712 away from the base substrate 711, so as to cover the wiring layer 712 at the bending region 715, a part of the wiring layer 712 at the driving circuit region 716 and a part of the wiring layer 712 at the peripheral region 713.

To be specific, during the formation of the protection layer 750, a first protection layer may be formed so as to cover the wiring layer 712 at the bending region 715, a part of the wiring layer 712 at the driving circuit region 716 and a part of the wiring layer 712 at the peripheral region 713. Next, a second protection layer may be formed on the first protection layer at the bending region 715 so as to cover the stress buffer member 717. In this way, a thickness of the portion of the protection layer 750 covering the stress buffer member 717 may be greater than a thickness of the portion of the protection layer 750 on the remaining base substrate 711 at the bending region 715, a thickness of the portion of the protection layer 750 at the driving circuit region 716, and a thickness of the portion of the protection layer 750 at the peripheral region 713. After bending the wiring layer 712 at the bending region 715, it is able to acquire the array substrate as shown in FIG. 6.

According to the array substrate, the manufacturing method thereof and the display panel in the embodiments of the present disclosure, the array substrate includes the base substrate and the wiring layer. The base substrate includes the peripheral region, the bending region and the driving circuit region, and the bending region is arranged between the driving circuit region and the peripheral region. A portion of the base substrate at the bending region is removed, and the remaining base substrate at the bending region forms the stress buffer member. The stress buffer member is arranged at the end of the bending region adjacent to the peripheral region, and connected to the portion of the base substrate at the peripheral region. Through removing the portion of the base substrate at the bending region and forming the stress buffer member using the remaining base substrate at the bending region, it is able to support the wiring layer and disperse the stress in the wiring layer, thereby to prevent the wire at the wiring layer from being broken due to the stress concentration and improve the flexibility and reliability of the array substrate.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a base substrate and a wiring layer, wherein the base substrate comprises a peripheral region, a bending region and a driving circuit region, the bending region is arranged between the driving circuit region and the peripheral region, and a portion of the base substrate at the bending region is a stress buffer member arranged at an end of the bending region adjacent to the peripheral region, connected to a portion of the base substrate at the peripheral region, and spaced apart from a portion of the base substrate at the driving circuit region, wherein the portion of the base substrate at the driving circuit region is arranged parallel to, and opposite to, the portion of the base substrate at the peripheral region, and the stress buffer member abuts against the wiring layer, wherein an end of the stress buffer member connected to the portion of the base substrate at the peripheral region has a thickness greater than an end of the stress buffer member away from the portion of the base substrate at the peripheral region.

2. The array substrate according to claim 1, wherein the stress buffer member is provided with an oblique surface adjacent to the wiring layer and angled relative to the portion of the base substrate at the peripheral region at an angle of 40° to 70°.

3. The array substrate according to claim 1, wherein the stress buffer member has a thickness smaller than the portions of the base substrate at the peripheral region and the driving circuit region, and the stress buffer member and the portion of the base substrate at the peripheral region together form a step-like structure.

4. The array substrate according to claim 3, wherein the stress buffer member is provided with a first surface, a second surface and an arc surface away from a portion of the wiring layer corresponding to the bending region, the first surface and the second surface are arranged parallel to the portions of the base substrate at the peripheral region and the driving circuit region and connected to each other through the arc surface, and the first surface is arranged adjacent to the peripheral region.

5. The array substrate according to claim 4, wherein a first side surface of the portion of the base substrate at the peripheral region adjacent to the stress buffer member is an oblique surface inclined relative to the first surface of the stress buffer member, and the first side surface and the first surface of the stress buffer member together form the step-like structure.

6. An array substrate, comprising a base substrate and a wiring layer, wherein the base substrate comprises a peripheral region, a bending region and a driving circuit region, the bending region is arranged between the driving circuit region and the peripheral region, and a portion of the base substrate at the bending region is a stress buffer member arranged at an end of the bending region adjacent to the peripheral region, connected to a portion of the base substrate at the peripheral region, and spaced apart from a portion of the base substrate at the driving circuit region,
wherein the stress buffer member has a thickness smaller than the portions of the base substrate at the peripheral region and the driving circuit region, and the stress buffer member and the portion of the base substrate at the peripheral region together form a step-like structure, and
wherein the thickness of the stress buffer member is 5 μm to 10 μm.

7. The array substrate according to claim 1, wherein a surface of the stress buffer member away from the portion of the wiring layer corresponding to the bending region is serrated.

8. The array substrate according to claim 1, wherein a side surface of the stress buffer member away from the wiring layer is a curved surface protruded in a direction away from the wiring layer, and a thickness of the end of the stress buffer member connected to the portion of the base substrate at the peripheral region and a thickness of an end of the stress buffer member away from the portion of the base substrate at the peripheral region are both smaller than a thickness of the other portion of the stress buffer member.

9. An array substrate, comprising a base substrate and a wiring layer, wherein the base substrate comprises a peripheral region, a bending region and a driving circuit region, the bending region is arranged between the driving circuit region and the peripheral region, and a portion of the base substrate at the bending region is a stress buffer member arranged at an end of the bending region adjacent to the peripheral region, connected to a portion of the base substrate at the peripheral region, and spaced apart from a portion of the base substrate at the driving circuit region, and
wherein a protection layer is arranged at a side surface of the wiring layer away from the base substrate, and a thickness of a portion of the protection layer covering the stress buffer layer is greater than a thickness of the other portion of the protection layer.

10. The array substrate according to claim 9, wherein the protection layer is arranged at a side of the wiring layer away from the portion of the base substrate at the peripheral region, a side of the wiring layer away from the portion of the base substrate at the bending region and a side of the wiring layer away from the portion of the base substrate at the driving circuit region.

11. The array substrate according to claim 10, wherein a thickness of a portion of the protection layer at a side of the wiring layer away from the stress buffer member is greater than a thickness of a portion of the protection layer at the side of the wiring layer away from the portion of the base substrate at the peripheral region and a thickness of a portion of the protection layer at the side of the wiring layer away from the portion of the base substrate at the driving circuit region.

12. The array substrate according to claim 1, wherein a buffer member is arranged between the portion of the base substrate at the driving circuit region and the portion of the base substrate at the peripheral region.

13. A display panel comprising the array substrate according to claim 1.

* * * * *